(12) United States Patent
Hu et al.

(10) Patent No.: US 12,342,683 B2
(45) Date of Patent: Jun. 24, 2025

(54) DISPLAY DEVICE, DISPLAY PANEL AND MANUFACTURING METHOD THEREOF

(71) Applicants: MIANYANG BOE OPTOELECTRONICS TECHNOLOGY CO., Ltd., Mianyang (CN); BOE TECHNOLOGY GROUP CO., LTD., Beijing (CN)

(72) Inventors: Jing Hu, Beijing (CN); Haoyuan Fan, Beijing (CN); Zifeng Wang, Beijing (CN); Haifeng Xu, Beijing (CN); Yanchun Xie, Beijing (CN); Junjie Tang, Beijing (CN); Jongkyun Lee, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 644 days.

(21) Appl. No.: 17/429,241

(22) PCT Filed: Jan. 12, 2021

(86) PCT No.: PCT/CN2021/071273
§ 371 (c)(1),
(2) Date: Aug. 6, 2021

(87) PCT Pub. No.: WO2021/164467
PCT Pub. Date: Aug. 26, 2021

(65) Prior Publication Data
US 2022/0310724 A1  Sep. 29, 2022

(30) Foreign Application Priority Data
Feb. 20, 2020 (CN) .......................... 202010104934.5

(51) Int. Cl.
*H10K 59/122* (2023.01)
*H10K 50/844* (2023.01)
(Continued)

(52) U.S. Cl.
CPC ......... *H10K 59/122* (2023.02); *H10K 50/844* (2023.02); *H10K 71/00* (2023.02); *H10K 59/1201* (2023.02)

(58) Field of Classification Search
CPC .... H10K 59/122; H10K 50/844; H10K 71/00; H10K 59/1201; H10K 59/1216;
(Continued)

(56) References Cited

U.S. PATENT DOCUMENTS

2020/0312273 A1* 10/2020 Hu ............................ G09G 5/10
2021/0408150 A1* 12/2021 Zhang ..................... H10K 59/65

FOREIGN PATENT DOCUMENTS

| CN | 101080950 A | * 11/2007 | ......... H01L 27/3246 |
| CN | 108334825 A | * 7/2018 | ....... G02F 1/133603 |

(Continued)

OTHER PUBLICATIONS

International Search Report and Written Opinion for International Application No. PCT/CN2021/071273 mailed Mar. 31, 2021.

*Primary Examiner* — Mohammed Shamsuzzaman
(74) *Attorney, Agent, or Firm* — XSENSUS LLP

(57) ABSTRACT

A display panel includes a substrate, a drive layer, an isolation column, a light emitting device layer, and a through hole. The substrate has an opening area, a transition area surrounding the opening area, and a display area surrounding the transition area. The drive layer is arranged on a side of the substrate and covers the display area and the transition area. The portion of the drive layer located in the transition area includes a light reflective layer surrounding the opening area. The isolation column is arranged on a surface of the (Continued)

drive layer facing away from the substrate and is located in the transition area. The isolation column surrounds the opening area. A contour line of a projection of the isolation column on the substrate is located inside a contour line of a projection of the light reflective layer on the substrate.

7 Claims, 5 Drawing Sheets

(51) Int. Cl.
    *H10K 71/00*     (2023.01)
    *H10K 59/12*     (2023.01)

(58) Field of Classification Search
    CPC .... H10K 59/126; H10K 59/123; H10K 59/65; H10K 59/88; H10K 59/1213
    See application file for complete search history.

(56) References Cited

FOREIGN PATENT DOCUMENTS

| | | | | | |
|---|---|---|---|---|---|
| CN | 109599030 | A | * | 4/2019 | ............... G09F 9/00 |
| CN | 109802052 | A | | 5/2019 | |
| CN | 109935730 | A | | 6/2019 | |
| CN | 110416282 | A | | 11/2019 | |
| CN | 110518141 | A | | 11/2019 | |
| CN | 110649177 | A | | 1/2020 | |
| CN | 111162196 | A | * | 5/2020 | ......... H01L 27/3232 |
| CN | 111293148 | A | | 6/2020 | |
| JP | 2012204370 | A | * | 10/2012 | ....... G02F 1/133603 |
| WO | 2020192293 | A1 | | 10/2020 | |

\* cited by examiner

DISPLAY DEVICE, DISPLAY PANEL AND MANUFACTURING METHOD THEREOF

CROSS-REFERENCE TO RELATED APPLICATIONS

The present application is a national phase application under 35 U.S.C. § 371 of International Application No. PCT/CN2021/071273 filed Jan. 12, 2021, which claims the benefit of and priority to Chinese Patent Application No. 202010104934.5 entitled "Display device, display panel and manufacturing method thereof," filed on Feb. 20, 2020, where the contents of both of which are incorporated by reference in their entireties herein.

TECHNICAL FIELD

The present disclosure relates to the field of display technology and, in particular to a display device, a display panel, and a manufacturing method of the display panel.

BACKGROUND

In various electronic devices, such as mobile phones and tablet computers, it is often necessary to open holes in the display panel to install electronic devices such as cameras and sensors. For OLED (Organic Light-Emitting Diode) display panels, external water and oxygen may enter the interior of the display panel from the opening position along the light emitting layer, causing erosion to the interior of the display panel. However, there is a need to improve the effect of preventing water and oxygen erosion of the existing display panels, which will affect the display effect.

It should be noted that the information disclosed in the background mentioned above is only used to enhance the understanding of the background of the present disclosure, and therefore may include information that does not constitute prior art known to those of ordinary skill in the art.

SUMMARY

A purpose of the present disclosure is to provide a display device, a display panel, and a manufacturing method thereof.

According to an aspect of the present disclosure, there is provided a display panel comprising:
  a substrate which has an opening area, a transition area surrounding the opening area, and a display area surrounding the transition area;
  a drive layer which is provided on a side of the substrate and covers the display area and the transition area, wherein a portion of the drive layer located in the transition area comprises a light reflective layer surrounding the opening area;
  an isolation column which is arranged on a surface of the drive layer facing away from the substrate and is located in the transition area, wherein the isolation column surrounds the opening area, and a contour line of a projection of the isolation column on the substrate is located inside a contour line of a projection of the light reflective layer on the substrate; and a side wall of the isolation column is provided with a groove;
  a light emitting device layer which covers the drive layer and the isolation column, wherein the light emitting device layer comprises a light emitting layer, and the light emitting layer is discontinuous at the groove;
  a through hole which penetrates the drive layer and the light emitting device layer and is located in the opening area.

In an exemplary embodiment of the present disclosure, the drive layer is formed with a boss in an area of the drive layer corresponding to the light reflective layer, the boss matches a shape of the light reflective layer, and the isolation column is provided on a surface of the boss facing away from the substrate.

In an exemplary embodiment of the present disclosure, in a direction perpendicular to the substrate, a portion of the drive layer corresponding to the isolation column has a plurality of the light reflective layers.

In an exemplary embodiment of the present disclosure, in two adjacent light reflective layers in the direction perpendicular to the substrate, a contour line of a projection of the light reflective layer facing away from the substrate on the substrate is located inside a contour line of a projection of the light reflective layer close to the substrate on the substrate.

In an exemplary embodiment of the present disclosure, a distance between the contour line of the projection of the light reflective layer on the substrate and the contour line of the projection of the isolation column on the substrate is greater than 1 μm.

In an exemplary embodiment of the present disclosure, the number of the isolation columns is multiple, and each of the isolation columns is arranged concentrically around the opening area;
  in the direction perpendicular to the substrate, a portion of the drive layer corresponding to each of the isolation columns has a plurality of the light reflective layers.

In an exemplary embodiment of the present disclosure, in the direction perpendicular to the substrate, a portion of the drive layer corresponding to the isolation column has two light reflective layers;
  the drive layer comprises a thin film transistor and a capacitor electrode in the display area, and a gate of the thin film transistor and the capacitor electrode form a storage capacitor;
  the gate and one of the light reflective layers are arranged in a same layer, the capacitor electrode and another light reflective layer are arranged in a same layer, and a source and a drain of the thin film transistor and the isolation column are arranged in a same layer.

In an exemplary embodiment of the present disclosure, the isolation column comprises a first metal layer, a second metal layer and a third metal layer that are sequentially stacked in a direction away from the substrate, and an outer edge of the first metal layer and an outer edge of the third metal layer protrude out of an outer edge of the second metal layer so as to form the groove on a side wall of the isolation column; at least one of the first metal layer, the second metal layer and the third metal layer comprises a reflective metal material.

In an exemplary embodiment of the present disclosure, a material of the first metal layer and the third metal layer comprises titanium, and a material of the second metal layer comprises aluminum.

In an aspect of the disclosure, there is provided a manufacturing method for a display panel, comprising:
  providing a substrate, wherein the substrate has an opening area, a transition area surrounding the opening area, and a display area surrounding the transition area;
  forming a drive layer covering both the display area and the transition area on a side of the substrate, wherein a portion of the drive layer located in the transition area comprises a light reflective layer surrounding the opening area;

forming an isolation column, which is located in the transition area and surrounds the opening area, on a surface of the drive layer facing away from the substrate, wherein a contour line of a projection of the isolation column on the substrate is located inside a contour line of a projection of the light reflective layer on the substrate; and a side wall of the isolation column is provided with a groove;

forming a light emitting device layer which covers the drive layer and the isolation column, wherein the light emitting device layer comprises a light emitting layer, and the light emitting layer is discontinuous at the groove;

forming a through hole in the opening area, wherein the through hole penetrates the drive layer and the light emitting device layer.

In an exemplary embodiment of the present disclosure, in a direction perpendicular to the substrate, a portion of the drive layer corresponding to the isolation column has a plurality of the light reflective layers.

In an exemplary embodiment of the present disclosure, in a direction perpendicular to the substrate, a portion of the drive layer corresponding to the isolation column has a first light reflective layer and a second light reflective layer;

forming the drive layer covering both the display area and the transition area on the side of the substrate comprises:

forming an active layer in the display area on a side of the substrate;

forming a gate insulating layer covering the active layer;

forming a gate located in the display area and a first light reflective layer located in the transition area, through one patterning process, on a side of the gate insulating layer facing away from the substrate;

forming an insulating layer covering both the gate and the first light reflective layer;

forming a capacitor electrode directly facing the gate and a second light reflective layer directly facing the first light reflective layer, through one patterning process, on a surface of the insulating layer facing away from the substrate;

forming a dielectric layer covering both the capacitor electrode and the second light reflective layer, and the dielectric layer being formed with a boss in an area corresponding to the second light reflective layer;

forming a source-drain layer on a side of the dielectric layer facing away from the substrate, and the source-drain layer comprising a source and a drain connected to the active layer.

In an exemplary embodiment of the present disclosure, the isolation column and the source-drain layer are formed by one same patterning process, and the isolation column is located on a surface of the boss facing away from the substrate.

In an aspect of the disclosure, there is provided a display device comprising the display panel according to any one of above items.

It should be understood that the above general description and the following detailed description are only exemplary and explanatory, and cannot limit the present disclosure.

BRIEF DESCRIPTION OF THE DRAWINGS

The drawings herein are incorporated into the specification and constitute a part of the specification, show embodiments in accordance with the present disclosure, and are used to explain the principle of the present disclosure together with the specification. Understandably, the drawings in the following description are only some embodiments of the present disclosure. For those of ordinary skill in the art, other drawings may be obtained based on these drawings without creative work.

DETAILED DESCRIPTION

Figure 1:
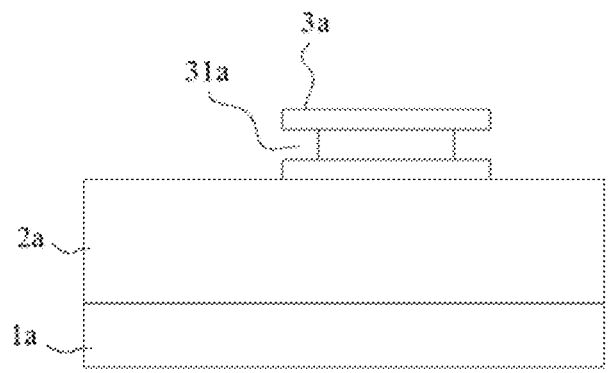
FIG. 1 is a partial schematic diagram of a display panel in the related art.

Example embodiments will now be described more fully with reference to the accompanying drawings. However, the example embodiments may be implemented in various forms, and should not be construed as being limited to the examples set forth herein; on the contrary, these embodiments are provided to make the present disclosure more comprehensive and complete, and fully convey the concept of the example embodiments to those skilled in the art. The same reference numerals in the figures indicate the same or similar structures, and thus their detailed descriptions will be omitted. In addition, the drawings are only schematic illustrations of the present disclosure, and are not necessarily drawn to scale.

Although relative terms such as "upper" and "lower" are used in this specification to describe the relative relationship between labeled one component and another component, these terms are used in this specification only for convenience, for example, exemplary directions as shown according to the drawings. It may be understood that if the labeled device is turned over and turned upside down, the component described as "upper" will become the "lower" component. When a structure is "on" another structure, it may mean that a certain structure is integrally formed on other structures, or that a certain structure is "directly" arranged on other structures, or that a certain structure is "indirectly" arranged on other structures through another structure.

The terms "a", "an", "the", and "said" are used to indicate the presence of one or more elements/components/etc.; the terms "include" and "comprise" are used to mean openended inclusion and means that there may be additional elements/components/etc. in addition to the listed elements/components/etc.; the terms "first", "second", and "third" are only used as marks, not limit the number of its objects.

Descriptions of the reference signs used in the figures are as follows: 100: display panel; 1: substrate; 101: opening area; 102: transition area; 103: display area; 2: drive layer; 201: light reflective layer; 201a: first light reflective layer; 201b: second light reflective layer; 202: boss; 21: active layer; 22: gate insulation layer; 23: gate; 24: insulation layer; 25: capacitor electrode; 26: dielectric layer; 27: source; 28: drain; 3: isolation column; 301: groove; 31: first metal layer; 32: second metal layer; 33: third metal layer; 3a: first isolation column; 3b: second isolation column; 4: light emitting device layer; 401: light emitting layer; 402: first electrode; 403: second electrode; 5: through hole; 6: planarization layer; 7: pixel defining layer; and 8: filling layer.

In the related art, the display panel has a display area, a transition area, and an opening area. The transition area surrounds the opening area, and the display area surrounds the transition area. The opening area can be provided with through holes for setting cameras and other devices. As shown in FIG. 1, FIG. 1 shows a part of the display panel, namely the transition area. The transition area may include a substrate 1a, a drive layer 2a, and an isolation column 3a which is provided on a side of the drive layer 2a facing away from the substrate 1a. An inner side wall and an outer side wall of the isolation column 3a are provided with grooves 31a. When a light emitting layer of organic material is formed on a side of the drive layer 2a facing away from the substrate 1, the light emitting layer can be disconnected at the grooves 31a. However, when forming the isolation column 3a, a photoresist may remain in the grooves 31a to fill the isolation column 3a so that the light emitting layer cannot be disconnected at the grooves 31a. Thus, it is difficult to block a path of water and oxygen from eroding the display area along the light emitting layer.

In addition, in order to ensure the effect of blocking the light emitting layer, grooves 31a are also provided on both sides of the isolation column 3a to further block the light emitting layer, but the drive layer 2a needs to be grooved which increases the difficulty of the process.

Embodiments of the present disclosure provide a display panel, which may be an OLED display panel, and may be provided with a through hole for installing a camera or another device The through hole may be surrounded by a transition area, and the transition area may be surrounded by a display area that can emit light.

Figure 2:
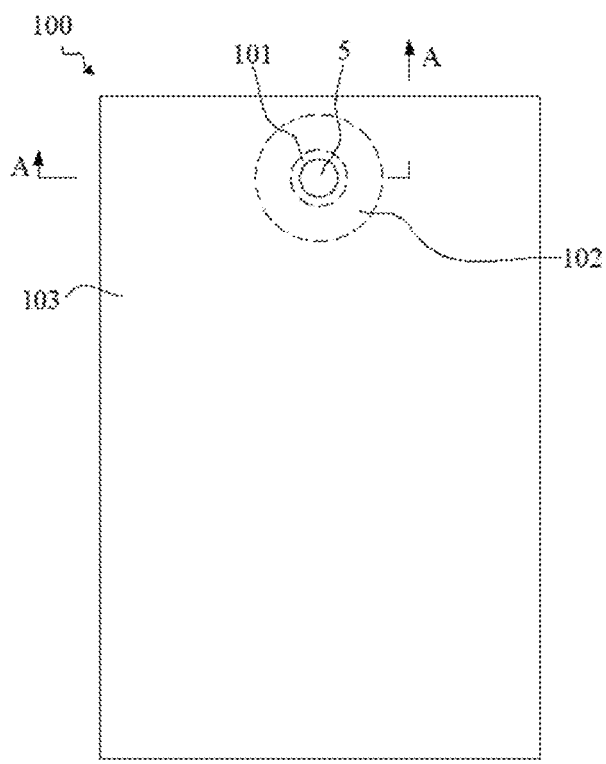
FIG. 2 is a top view of an embodiment of a display panel of the present disclosure.
Figure 3:
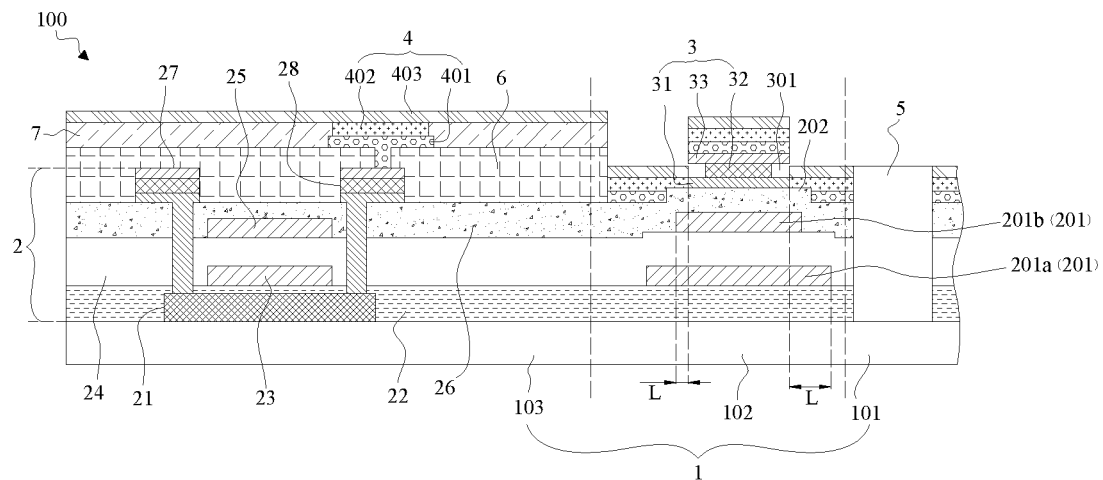
FIG. 3 is a cross-sectional view taken along the line A-A in FIG. 2.

As shown in FIGS. 2 and 3, the display panel 100 of an embodiment of the present disclosure may include a substrate 1, a drive layer 2, an isolation column 3, a light emitting device layer 4, and a through hole 5.

The substrate 1 has an opening area 101, a transition area 102 surrounding the opening area 101, and a display area 103 surrounding the transition area 102.

The drive layer 2 is provided on a side of the substrate 1 and covers the display area 103 and the transition area 102. A portion of the drive layer 2 located in the transition area 102 includes a light reflective layer 201 surrounding the opening area 101.

The isolation column 3 is provided on a surface of the drive layer 2 facing away from the substrate 1 and is located in the transition area 102. The isolation column 3 surrounds the opening area 101. A contour line of a projection of the isolation column 3 on the substrate 1 is located inside a contour line of a projection of the light reflective layer 201 on the substrate 1, and a side wall of the isolation column 3 is provided with a groove 301.

The light emitting device layer 4 covers the drive layer 2 and the isolation column 3. The light emitting device layer 4 includes a light emitting layer 401, and the light emitting layer 401 is discontinuous at the groove 301.

The through hole 5 penetrates the drive layer 2 and the light emitting device layer 4 and is located in the opening area 101.

In the display panel of the embodiment of the present disclosure, the light emitting layer 401 of the light emitting device layer 4 is partitioned by the groove 301, blocking a path of water and oxygen at the through hole 5 eroding the display area 103, thereby preventing the light emitting device layer 4 of the display area 103 from being eroded. At the same time, since the contour line of the projection of the isolation column 3 on the substrate 1 is located inside the contour line of the projection of the light reflective layer 201 on the substrate 1, an edge of the light reflective layer 201 exceeds an edge of the isolation column 3, and the excess part can reflect light in a direction away from the substrate 1, so that the groove 301 on the side wall of the isolation column 3 can be illuminated by light, preventing the groove 301 from being filled with residual photoresist, thereby ensuring that the groove 301 can partition the light emitting layer 401 and the isolation column 3 can block the path of water and oxygen erosion for improving the display effect. In addition, since the blocking effect on the light emitting layer 401 is improved, it is possible to avoid from setting up a special partition groove for partitioning the light emitting layer 401 at the positions of the drive layer 2 located on both sides of the isolation column 3.

Hereinafter, each part of the display panel 100 of the embodiment of the present disclosure will be described in detail.

As shown in FIGS. 2 and 3, the substrate 1 can be divided into a plurality of areas, including the opening area 101, the transition area 102, and the display area 103. The transition area 102 surrounds the opening area 101, and the display area 103 surrounds the transition area 102. The opening area 101 corresponds to the opening area of the display panel 100, the transition area 102 corresponds to the transition area of the display panel 100, and the display area 103 corresponds to the display area of the display panel 100.

The substrate 1 may be a single-layer or multi-layer structure. For example, the substrate 1 may include a glass substrate and a buffer layer on the glass substrate, and the material of the buffer layer may include silicon nitride, silicon oxide, and the like.

As shown in FIGS. 2 and 3, the drive layer 2 is provided on a side of the substrate 1. For example, the drive layer 2 is provided on a surface of the buffer layer facing away from the glass substrate. The drive layer 2 covers the display area 103 and the transition area 102. A portion of the drive layer 2 located in the transition area 102 includes the light reflective layer 201, and the light reflective layer 201 may have a ring structure, which may be arranged around the opening area 101. The material of the light reflective layer 201 includes opaque metal or other light reflective materials, so that light can be reflected toward a side thereof facing away from the substrate 1.

As shown in FIGS. 2 and 3, the isolation column 3 is arranged on a surface of the drive layer 2 away from the substrate 1 and is located in the transition area 102, and the isolation column 3 may be a ring structure and is arranged around the opening area 101. A side wall of the isolation column 3 is provided with the groove 301, that is, at least one of the inner wall and the outer wall of the ring structure is provided with the groove 301. When forming the light emitting layer 401 of the light emitting device layer 4, the light emitting layer 401 is disconnected at the groove 301, thereby blocking the path of water and oxygen erosion.

The contour line of the projection of the isolation column 3 on the substrate 1 is located inside the contour line of the projection of the light reflective layer 201 on the substrate 1, so that the edge of the light reflective layer 201 extends beyond the edge of the isolation column 3, and the excess part can reflect light to a side facing away from the substrate 1, wherein at least part of the light can be reflected into the groove 301. If the photoresist is a positive photoresist, the light reflected by the light reflective layer 201 may expose the photoresist in the groove 301 for development so as to remove the photoresist and prevent the remaining photoresist from filling the groove 301, ensuring that the light emitting layer 401 is discontinuous at the groove 301.

In some embodiments of the present disclosure, as shown in FIG. 3, due to the presence of the light reflective layer 201, a boss 202 that matches the shape of the light reflective layer 201 may be formed on the area of the drive layer 2 corresponding to the light reflective layer 201. The isolation column 3 may be arranged on a surface of the boss 202 facing away from the substrate 1, so that the isolation column 3 can be raised by the light reflective layer 201, a height difference between the isolation column 3 and the drive layer 2 is increased, it difficult for the light emitting layer 401 to cover the side of the isolation column 3, and the blocking effect of the isolation column 3 on the light emitting layer 401 is enhanced.

Further, as shown in FIG. 3, in a direction perpendicular to the substrate 1, a portion of the drive layer 2 corresponding to the same isolation column 3 may have a plurality of the light reflective layers 201, for example, two light reflective layers 201, thereby facilitating increasing the height of the boss 202 and further raising the isolation column.

Further, in order to improve the light reflection effect, as shown in FIG. 3, in the two adjacent light reflection layers 201 in the direction perpendicular to the substrate 1, a contour line of a projection of the light reflective layer 201 facing away from the substrate 1 on the substrate 1 is located inside a contour line of a projection of the light reflective layer 201 close to the substrate 1 on the substrate 1. That is, the area of the light reflective layer 201 decreases in the direction away from the substrate 1, so that each light reflective layer 201 may reflect light to a side facing away from the substrate 1, which is beneficial to increase the light entering the groove 301 and further reduce the photoresist residue.

In some embodiments of the present disclosure, as shown in FIG. 3, a distance L between the contour line of the projection of the light reflective layer 201 on the substrate 1 and the contour line of the projection of the isolation column 3 on the substrate 1 is greater than 1 μm. That is, a difference between the width of the cross section of the light reflective layer 201 and the width of the cross section of the isolation column 3 is greater than 1 μm, so as to ensure that enough light is reflected into the groove 301.

Figure 5:
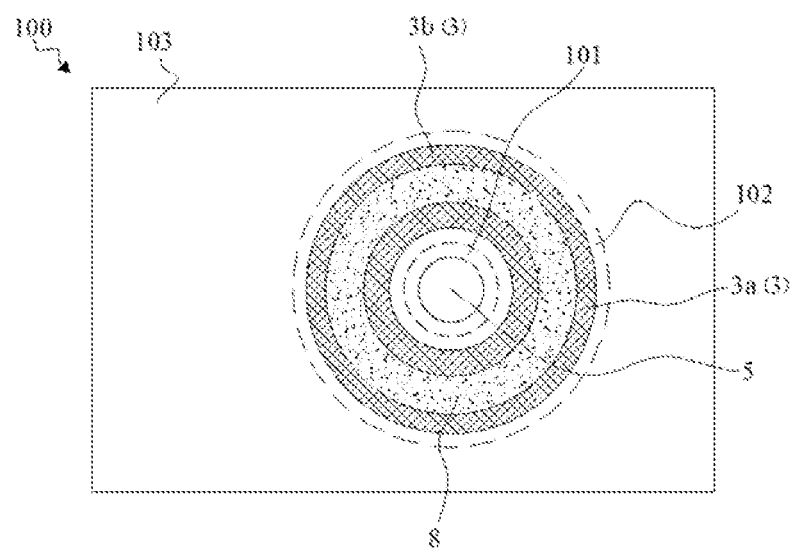
FIG. 5 is a top view of the isolation column in another embodiment of the display panel of the present disclosure.

In some embodiments of the present disclosure, as shown in FIG. 5, the number of isolation columns 3 may be multiple, the sizes of the isolation columns 3 may be different, and the isolation columns 3 are arranged concentrically around the opening area 101, thereby increasing the blocking effect to the light emitting layer 401. For example, the isolation column 3 includes a first isolation column 3a and a second isolation column 3b, wherein the first isolation column 3a surrounds the opening area 101, and the second isolation column 3b surrounds the first isolation column 3a. At the same time, a filling layer 8 may be arranged between the first isolation column 3a and the second isolation column 3b to separate the first isolation column 3a and the second isolation column 3b.

Further, in the direction perpendicular to the substrate 1, a portion of the drive layer 2 corresponding to each isolation column 3 has a plurality of the light reflective layers 201. That is, a side of each isolation column 3 close to the substrate 1 has a plurality of the light reflective layers 201, for example, two light reflective layers 201.

Figure 4:
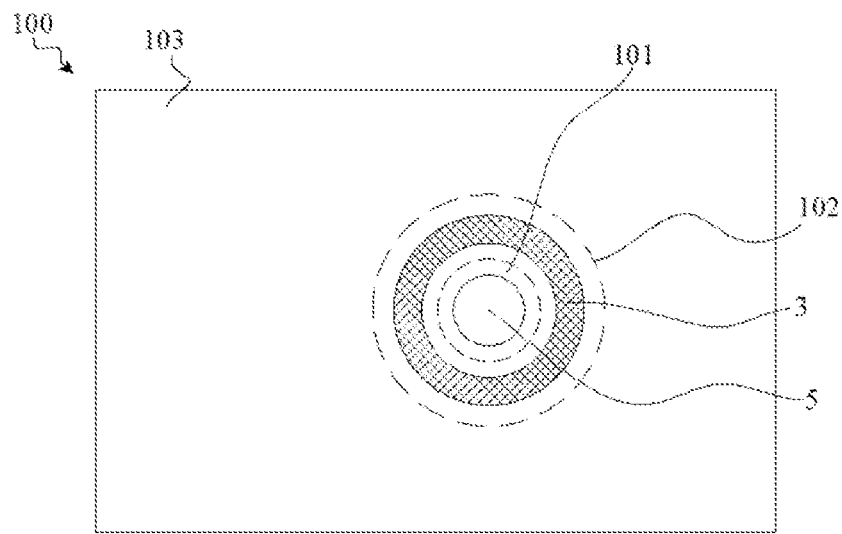
FIG. 4 is a top view of an isolation column in an embodiment of the display panel of the present disclosure.

Of course, in other embodiments of the present disclosure, as shown in FIGS. 3 and 4, the number of the isolation columns 3 may also be one. In addition, a portion of the drive layer 2 corresponding to the same isolation column 3 may also have only one light reflective layer 201.

In some embodiments of the present disclosure, as shown in FIG. 3, a portion of the drive layer 2 corresponding to the same isolation column 3 has two light reflective layers 201. The drive layer 2 includes a thin film transistor and a capacitor electrode in the display area 103, and the capacitor electrode directly faces a gate of the thin film transistor and forms a storage capacitor.

The gate of the thin film transistor and one light reflective layer 201 are arranged in the same layer, so that the two light reflective layers 201 can be formed at the same time as the gate and the capacitor electrode of the thin film transistor, respectively, thereby simplifying the process. At the same time, a source and a drain of the thin film transistor and the isolation column 3 are arranged in the same layer, so that the source, the drain, and the isolation column 3 may be formed at the same time, thereby simplifying the process.

For example, as shown in FIG. 3, the thin film transistor has a top gate structure, and the drive layer 2 includes an active layer 21, a gate insulating layer 22, a gate 23, an insulating layer 24, a capacitor electrode 25, a dielectric layer 26 and a source-drain layer which are sequentially stacked on a side of the substrate 1. The active layer 21, the gate 23 and the capacitor electrode 25 directly face one another in the direction perpendicular to the substrate 1. The source-drain layer includes a source 27 and a drain 28, and is connected to both ends of the active layer 21.

A portion of the drive layer 2 corresponding to the same isolation column 3 also has two light reflective layers 201, including a first light reflective layer 201a and a second light reflective layer 201b. The gate 23 and the first light reflective layer 201a are arranged in a same layer, and the capacitor electrode 25 and the second light reflective layer 201b are arranged in a same layer. The first light reflective layer 201a and the second light reflective layer 201b are separated by the stacked gate insulating layer 22 and the insulating layer 24. At the same time, the source-drain layer and the isolation column 3 are arranged in a same layer so as to be formed by one patterning process.

In some embodiments of the present disclosure, as shown in FIG. 3, the isolation column 3 includes a first metal layer 31, a second metal layer 32 and a third metal layer 33 that are sequentially stacked in a direction away from the substrate 1. An outer edge of the first metal layer 31 and an outer edge of the third metal layer 33 both extend beyond an outer edge of the second metal layer 32 to form the groove 301 on a side wall of the isolation column 3, so that the cross section of the isolation column 3 is in a "I" shape.

At least one of the first metal layer 31, the second metal layer 32 and the third metal layer 33 includes a reflective metal material, so as to achieve light reflection. For example, the material of the first metal layer 31 and the third metal layer 33 includes titanium, and the material of the second metal layer 32 includes aluminum.

The source 27 and the drain 28 each may also include three metal layers, which are arranged in same layers corresponding to the first metal layer 31, the second metal layer 32 and the third metal layer 33 one by one so as to be formed at the same time.

As shown in FIG. 3, the light emitting device layer 4 covers the drive layer 2 and the isolation column 3, and the light emitting device layer 4 includes the light emitting layer 401. The material of the light emitting layer 401 may include an electro-organic light emitting material, and the light emitting layer 401 is discontinuous at the groove 301, thereby blocking the path of water and oxygen erosion.

In some embodiments of the present disclosure, as shown in FIG. 3, the display panel 100 may further include a planarization layer 6 provided in the display area 103 and covering the source-drain layer. The light emitting device layer 4 further includes a first electrode 402 and a second electrode 403. The number of the first electrodes 402 can be multiple, and the first electrodes 402 are arranged on a side of the drive layer 2 away from the substrate 1 and are located in the display area 103. The first electrodes 402 can be connected to the drains 28 of the thin film transistors in a one-to-one correspondence, and at the same time, the side of the drive layer 2 away from the substrate 1 may also be provided with a pixel defining layer 7 exposing each first electrode 402. The light emitting layer 401 is disposed on a surface of the first electrode 402 away from the substrate 1, extends to the transition area 102, covers the isolation column 3, and is disconnected at the groove 301. The second electrode 403 is provided on a surface of the light emitting layer 401 away from the substrate 1, a plurality of OLED light emitting devices are formed by the first electrode 402, the light emitting layer 401 and the second electrode 403, and each OLED light emitting device can be driven by the thin film transistor to emit light.

As shown in FIG. 3, the through hole 5 penetrates the drive layer 2 and the light emitting device layer 4, and is located in the opening area 101 so as to arrange an electronic device such as a camera, a sensor, and the like. The shape of the through hole 5 is not particularly limited here.

Figure 6:
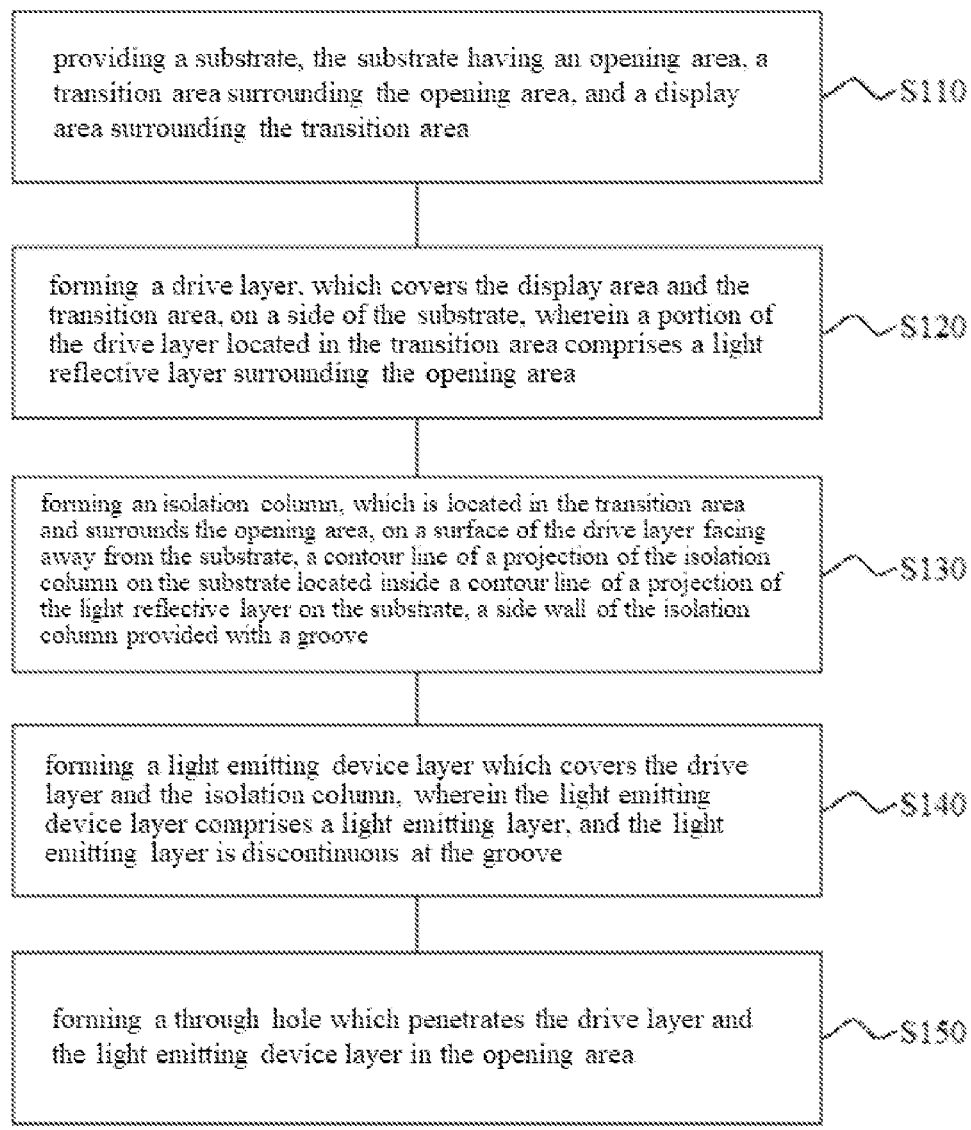
FIG. 6 is a flowchart of an embodiment of a manufacturing method of the present disclosure.

The embodiments of the present disclosure provide a manufacturing method for a display panel. For the structure of the display panel, the above-mentioned display panel embodiments can be referred to and will not be described in detail here. As shown in FIG. 6, the manufacturing method of the embodiment of the present disclosure may include step S110-step S150, wherein:

Step S110: providing a substrate, wherein the substrate has an opening area, a transition area surrounding the opening area, and a display area surrounding the transition area;

Step S120: forming a drive layer, which covers the display area and the transition area, on a side of the substrate, wherein a portion of the drive layer located in the transition area comprises a light reflective layer surrounding the opening area;

Step S130: forming an isolation column, which is located in the transition area and surrounds the opening area, on a surface of the drive layer facing away from the substrate, wherein a contour line of a projection of the isolation column on the substrate is located inside a contour line of a projection of the light reflective layer on the substrate; and a side wall of the isolation column is provided with a groove;

Step S140: forming a light emitting device layer which covers the drive layer and the isolation column, wherein the light emitting device layer comprises a light emitting layer, and the light emitting layer is discontinuous at the groove;

Step S150: forming a through hole which penetrates the drive layer and the light emitting device layer in the opening area.

The specific structures and beneficial effects of the substrate, the drive layer, the isolation column, the light emitting device layer and the through hole in the manufacturing method of the embodiment of the present disclosure have been described in the embodiments of the display panel above, and will not be repeated here.

In some embodiments of the present disclosure, as shown in FIG. 3, in a direction perpendicular to the substrate 1, a portion of the drive layer 2 corresponding to the isolation column 3 has a first light reflective layer 201a and a second light reflective layer 201b.

Forming the drive layer, which covers the display area and the transition area, on the side of the substrate (that is, step S120) includes step S1210-step S1270, wherein:

Step S1210, forming an active layer in the display area on a side of the substrate;

Step S1220, forming a gate insulating layer covering the active layer;

Step S1230, forming a gate located in the display area and a first light reflective layer located in the transition area, through one patterning process, on a side of the gate insulating layer facing away from the substrate;

Step S1240, forming an insulating layer covering both the gate and the first light reflective layer;

Step S1250, forming a capacitor electrode directly facing the gate and a second light reflective layer directly facing the first light reflective layer, through one patterning process, on a surface of the insulating layer facing away from the substrate;

Step S1260, forming a dielectric layer covering both the capacitor electrode and the second light reflective layer, and the dielectric layer being formed with a boss in an area corresponding to the second light reflective layer;

Step S1270, forming a source-drain layer on a side of the dielectric layer facing away from the substrate, and the source-drain layer comprising a source and a drain connected to the active layer.

Figure 7:
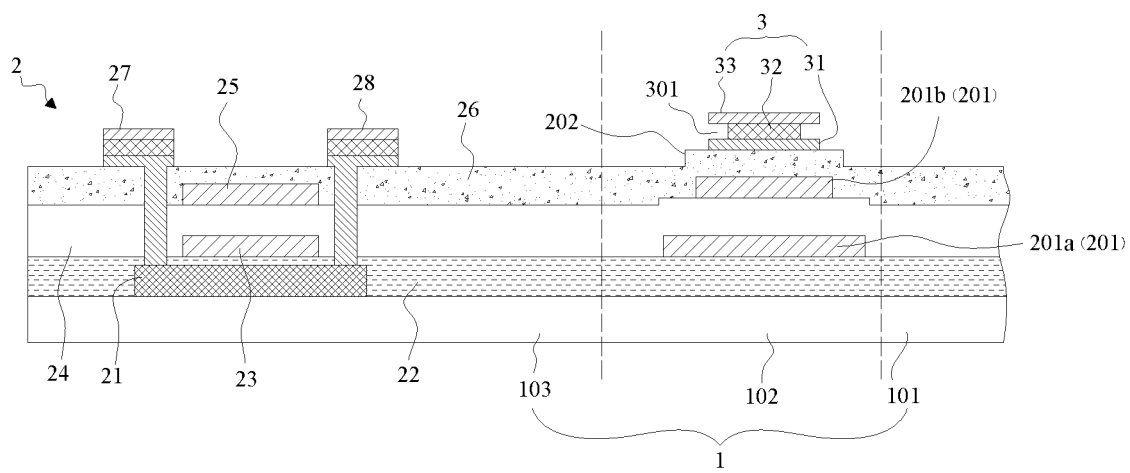
FIG. 7 is a schematic diagram of step S130 in an embodiment of the manufacturing method of the present disclosure.

As shown in FIG. 7, the isolation column 3 and the source-drain layer are formed by the same patterning process, and the isolation column 3 is located on a surface of the boss 202 away from the substrate 1. One patterning process may include one or more processes such as photolithography and printing, which are not particularly limited here, as long as the isolation column 3 and the source-drain layer can be formed at the same time. For example, the isolation column 3 includes a first metal layer 31, a second metal layer 32 and a third metal layer 33 that are sequentially stacked in a direction away from the substrate 1; the source-drain layer may also include three metal layers, namely the source 27 and the drain 28 each may include three metal layers, wherein the first metal layer 31, the second metal layer 32 and the third metal layer 33 can be formed simultaneously with the three metal layers of the source-drain layer in a one-to-one correspondence.

Of course, in other embodiments of the present disclosure, the isolation column 3 and the source-drain layer can also be formed independently. For details of the display panel manufactured by the manufacturing method of the embodiment of the present disclosure, reference may be made to the embodiment of the display panel, which will not be repeated here.

It should be noted that although the various steps of the method in the present disclosure are described in a specific order in the drawings, this does not require or imply that these steps must be performed in the specific order, or that all the steps shown must be performed to achieve the desired result. Additionally or alternatively, some steps may be omitted, multiple steps may be combined into one step for execution, and/or one step may be decomposed into multiple steps for execution, etc.

The embodiments of the present disclosure also provide a display device, which may include the display panel of any of the above-mentioned embodiments, and for its structure and beneficial effects, the above-mentioned embodiments of the display panel can be referred to and will not be described in detail here. The display device in the embodiments of the present disclosure may be a device for displaying images, such as a mobile phone, a tablet computer, or a television, which will not be listed here.

Those skilled in the art will easily think of other embodiments of the present disclosure after considering the specification and practicing the disclosure disclosed herein. This application is intended to cover any variations, uses or adaptive changes of the present disclosure. These variations, uses or adaptive changes follow the general principles of the present disclosure and include common knowledge or conventional technical means in the technical field that are not disclosed in the present disclosure. The description and the embodiments are only regarded as exemplary, and the true scope and spirit of the present disclosure are pointed out by the claims.

What is claimed is:

1. A display panel, comprising:
    a substrate having an opening area, a transition area surrounding the opening area, and a display area surrounding the transition area;
    a drive layer provided on a side of the substrate and covering the display area and the transition area, wherein a portion of the drive layer is located in the transition area comprises a light reflective layer surrounding the opening area;
    an isolation column arranged on a surface of a boss of the drive layer facing away from the substrate and located in the transition area, wherein the isolation column surrounds the opening area, a contour line of a projection of the isolation column on the substrate is located within a contour line of a projection of the light reflective layer on the substrate, and the isolation column is used to partition the light emitting layer; and a side wall of the isolation column is provided with a groove;
    a light emitting device layer covers the drive layer and the isolation column, wherein the light emitting device layer comprises a light emitting layer, and the light emitting layer is discontinuous at the groove; and
    a through hole penetrating the drive layer and the light emitting device layer and located in the opening area;
    wherein in a direction perpendicular to the substrate, the light reflective layer in the portion of the drive layer corresponding to the isolation column comprises an upper light reflective layer and a lower light reflective layer;
    the drive layer comprises a thin film transistor and a capacitor electrode in the display area, and a gate of the thin film transistor and the capacitor electrode form a storage capacitor;
    the gate and the lower light reflective layer are arranged in a first layer, the capacitor electrode and the upper light reflective layer are arranged in a second layer, and a source and a drain of the thin film transistor and the isolation column are arranged in a third layer and
    wherein a distance between the contour line of the projection of the light reflective layer on the substrate and the contour line of the projection of the isolation column on the substrate is greater than 1 μm.

2. The display panel according to claim 1, wherein the boss matching a shape of the light reflective layer is formed in an area of the drive layer corresponding to the light reflective layer.

3. The display panel according to claim 1, wherein, the upper and lower light reflective layers in the direction perpendicular to the substrate, a contour line of a projection of the upper light reflective layer facing away from the substrate on the substrate is located within a contour line of a projection of the lower light reflective layer close to the substrate on the substrate.

4. The display panel of claim 1, wherein:
    the number of the isolation columns is multiple, and each of the isolation columns is arranged concentrically around the opening area; and
    in the direction perpendicular to the substrate, a portion of the drive layer corresponding to each of the isolation columns has the upper and lower light reflective layers.

5. The display panel of claim 1, wherein the isolation column comprises a first metal layer, a second metal layer and a third metal layer that are sequentially stacked in a direction away from the substrate, and an outer edge of the first metal layer and an outer edge of the third metal layer protrude from an outer edge of the second metal layer to form the groove on a side wall of the isolation column; at least one of the first metal layer, the second metal layer and the third metal layer comprises a reflective metal material.

6. The display panel of claim 5, wherein a material of the first metal layer and the third metal layer comprises titanium, and a material of the second metal layer comprises aluminum.

7. The display panel according to claim 1, wherein the display panel is part of a display device.

* * * * *